US012805254B2

(12) United States Patent
Lin et al.

(10) Patent No.: US 12,805,254 B2
(45) Date of Patent: Nov. 17, 2026

(54) LOADING AND UNLOADING SYSTEM FOR SILICON WAFER

(71) Applicant: LAPLACE (WUXI) SEMICONDUCTOR TECHNOLOGY CO., LTD., Wuxi (CN)

(72) Inventors: Jiaji Lin, Shenzhen (CN); Huan Zhou, Wuxi (CN); Xiang Shi, Wuxi (CN)

(73) Assignee: LAPLACE (WUXI) SEMICONDUCTOR TECHNOLOGY CO., LTD., Wuxi (CN)

(*) Notice: Subject to any disclaimer, the term of this patent is extended or adjusted under 35 U.S.C. 154(b) by 361 days.

(21) Appl. No.: 18/434,739

(22) Filed: Feb. 6, 2024

(65) Prior Publication Data

US 2024/0178030 A1 May 30, 2024

Related U.S. Application Data

(63) Continuation-in-part of application No. PCT/CN2022/076630, filed on Feb. 17, 2022.

(30) Foreign Application Priority Data

Nov. 16, 2021 (CN) ........................ 202111354801.4

(51) Int. Cl.
*H10P 72/30* (2026.01)
*H10P 72/00* (2026.01)
(Continued)

(52) U.S. Cl.
CPC ...... *H10P 72/3222* (2026.01); *H10P 72/0612* (2026.01); *H10P 72/3202* (2026.01);
(Continued)

(58) Field of Classification Search
CPC ...... H10P 72/78; H10P 72/7612; H10P 72/50; H10P 72/3411; H10P 72/3408;
(Continued)

(56) References Cited

U.S. PATENT DOCUMENTS

2020/0126831 A1* 4/2020 Feng .................. H10P 72/3206
2021/0398834 A1* 12/2021 Shen ...................... B24B 37/27
2022/0033197 A1* 2/2022 Phan ..................... B65G 47/91

FOREIGN PATENT DOCUMENTS

CN 207651463 U 7/2018
CN 208833001 U 5/2019
(Continued)

*Primary Examiner* — Glenn F Myers
(74) *Attorney, Agent, or Firm* — ScienBiziP, P.C.

(57) ABSTRACT

A loading and unloading system for silicon wafer includes a wafer guiding apparatus, a silicon wafer flipping apparatus, and a conveying apparatus. The wafer guiding apparatus includes a loading-guiding assembly, an unloading-guiding assembly, and a lateral conveying device connecting each of the loading-guiding assembly and the unloading-guiding assembly. The loading-guiding assembly controls loading of silicon wafers, the unloading-guiding assembly controls unloading of the silicon wafers. The silicon wafer flipping apparatus includes a silicon wafer flipping mechanism, a silicon wafer lateral moving mechanism, and a silicon wafer shift mechanism configured to control movement of the silicon wafer flipping mechanism, the silicon wafer flipping mechanism configured to flip the silicon wafers. The conveying apparatus is configured to control flowing of silicon wafers between a main apparatus and the silicon wafer flipping apparatus.

14 Claims, 10 Drawing Sheets

(51) Int. Cl.
*H10P 72/50* (2026.01)
*H10P 72/76* (2026.01)
*H10P 72/78* (2026.01)

(52) U.S. Cl.
CPC ...... *H10P 72/3218* (2026.01); *H10P 72/3402* (2026.01); *H10P 72/3408* (2026.01); *H10P 72/50* (2026.01); *H10P 72/7612* (2026.01); *H10P 72/78* (2026.01)

(58) Field of Classification Search
CPC ............. H10P 72/3304; H10P 72/3222; H10P 72/3218; H10P 72/3216; H10P 72/3211; H10P 72/3202; H10P 72/0612; H01L 21/67276; H01L 21/67736; H01L 21/67706; H01L 21/6773; H01L 21/67742; H01L 21/67775; H01L 21/67766; H01L 21/68; H01L 21/6838; H01L 21/68742; H01L 21/67718; H01L 21/67727; H01L 21/67745; H01L 21/67778; H01L 21/67796
See application file for complete search history.

(56) References Cited

FOREIGN PATENT DOCUMENTS

| | | | |
|---|---|---|---|
| CN | 112420571 | A | 2/2021 |
| CN | 214542175 | U | 10/2021 |

* cited by examiner

LOADING AND UNLOADING SYSTEM FOR SILICON WAFER

CROSS-REFERENCE TO RELATED APPLICATIONS

The present application is a continuation-in-part of International Application No. PCT/CN2022/076630 filed on Feb. 17, 2022, which claims the priority of the Chinese patent application No. 202111354801.4, filed on Nov. 16, 2021, and entitled “Feeding and discharging system for silicon wafer”, which are incorporated herein by reference in their entireties.

TECHNICAL FIELD

The subject matter herein generally relates to a field of photovoltaics, particularly relates to a loading and unloading system for silicon wafer.

BACKGROUND

In prior art, an unloading process of silicon wafers from a main apparatus to a wafer guiding machine and a loading process from the wafer guiding machine to the main apparatus are operated separately. Such feeding process requires a machine with complex structures which are costly. The two systems occupy a large space. Therefore, there is room for improvement in the art.

DETAILED DESCRIPTION

The following specific embodiments will illustrate the implementation methods of the present disclosure, and people skilled in the art can easily understand other advantages and effects of the present disclosure from content disclosed in this specification. The present disclosure can also be implemented or applied by different specific embodiments, and the details in this specification can be modified or changed based on different perspectives and applications without deviating from the spirit of the present disclosure. It should be noted that, without conflict, the following embodiments and their features can be combined with each other.

It should be noted that the figure illustrations provided in the following embodiments only illustrate basic concept of the present disclosure in a schematic manner. Therefore, the figure illustrations only display the components related to the present disclosure and are not drawn based on number, shape, and size of the components in actual implementation. The type, quantity, and proportion of each component in actual implementation can be arbitrarily changed, and a layout of components may also be more complex.

Figure 1:
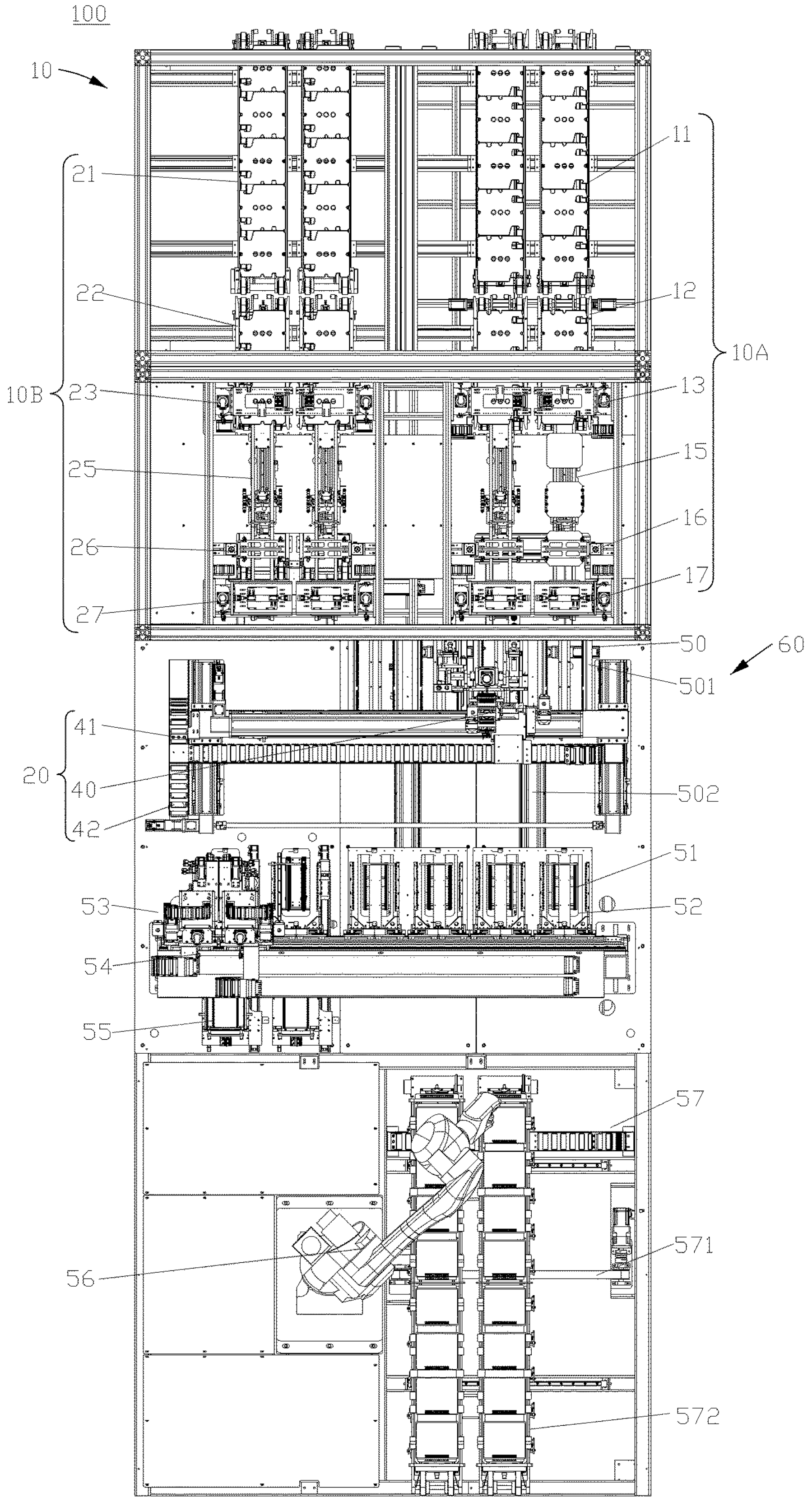
FIG. 1 is a top view of a loading and unloading system for silicon wafer of the present disclosure.

In the embodiments of the present disclosure, all directional indications (such as up, down, left, right, front, back, lateral, longitudinal . . . ) are only used to explain relative position relationship, motion situation, etc. between components in a specific posture. If the specific posture changes, the directional indication also changes accordingly. As shown in FIG. 1, a loading and unloading system 100 for silicon wafer includes a wafer guiding apparatus 10, a silicon wafer flipping apparatus 20, and a conveying apparatus 60. The wafer guiding apparatus 10 includes a loading-guiding assembly 10A, an unloading-guiding assembly 10B, and a lateral conveying device 30 connecting both the loading-guiding assembly 10A and the unloading-guiding assembly 10B. The loading-guiding assembly 10A controls loading of the silicon wafers, the unloading-guiding assembly 10B controls unloading of the silicon wafers, and the lateral conveying device 30 flows baskets of the feed guiding assembly and the discharge guiding assembly. The silicon wafer flipping apparatus 20 includes a silicon wafer flipping mechanism 40, a silicon wafer lateral moving mechanism 41, and a silicon wafer shift mechanism 42. The silicon wafer lateral moving mechanism 41 and the silicon wafer shift mechanism 42 control movement of the silicon wafer flipping mechanism 40. The silicon wafer flipping mechanism 40 controls suction and flipping of the silicon wafers. The silicon wafer flipping apparatus 20 and the conveying apparatus 60 control flowing of silicon wafers between a main apparatus and the silicon wafer flipping apparatus 20.

The loading-guiding assembly 10A includes sequentially connected a loading docking-conveying mechanism 11, a loading buffer conveying mechanism 12, a loading basket lifting mechanism 13, a loading basket conveying mechanism 14, a loading silicon wafer conveying mechanism 15, a loading silicon wafer buffer mechanism 16, and a loading-receiving mechanism 17. The loading basket conveying mechanism 14 is located on a lower side of the loading basket lifting mechanism 13. That is, the loading basket conveying mechanism 14 is under the loading basket lifting mechanism 13. The loading docking-conveying mechanism 11 is used to dock and convey incoming materials. The unloading-guiding assembly 10B includes sequentially connected an unloading docking-conveying mechanism 21, an unloading buffer conveying mechanism 22, an unloading basket lifting mechanism 23, an unloading basket conveying mechanism 24, an unloading silicon wafer conveying mechanism 25, an unloading silicon wafer buffer mechanism 26, and an unloading-receiving mechanism 27. The unloading basket conveying mechanism 24 is located on a lower side of the unloading basket lifting mechanism 23. That is, the unloading basket conveying mechanism 24 is under the unloading basket lifting mechanism 23. The unloading docking-conveying mechanism 21 is used to dock and convey incoming materials. The lateral conveying mechanism 30 is connected to each of the loading basket conveying mechanism 14 and the unloading basket conveying mechanism 24. The basket flows between the loading-guiding assembly 10A and the unloading-guiding assembly 10B by passing through the loading basket conveying mechanism 14, the lateral conveying mechanism 30, and the unloading basket conveying mechanism 24. The basket in the loading-guiding assembly receives unprocessed silicon wafers, and the basket in the unloading-guiding assembly receives processed silicon wafers.

In this embodiment, a structure of the loading-guiding assembly 10A is the same as a structure of the unloading-guiding assembly 10B. There are two loading-guiding assemblies 10A symmetrically arranged and two unloading-guiding assemblies 10B symmetrically arranged. The above loading-guiding assembly 10A will be explained as an example. The loading docking-conveying mechanism 11 adopts an AGV conveying line, which can simultaneously accommodate multiple baskets for conveying. Loading blocking cylinders 111 are fixedly on both ends of the loading docking-conveying mechanism 11 in the conveying direction. Two loading target sensors 112 are symmetrically fixed on two sides of an end face of the loading docking-conveying mechanism 11 near the loading buffer conveying mechanism 12. The two of loading target sensors 112 and the loading blocking cylinders 111 cooperate to achieve a purpose of sequentially transporting one basket to the loading buffer conveying mechanism 12. In addition, the loading docking-conveying mechanism 11 is also equipped with several sensors (not shown in the figure), and a number of sensors is consistent with a number of baskets that can be carried by the loading docking-conveying mechanism 11 once. A distance between adjacent sensors can be adjusted, and the sensors detect a full or short material status of the basket, achieving precise control of the number of silicon wafers.

A length of the loading buffer conveying mechanism 12 matches a length of one single basket. That is, the loading buffer conveying mechanism 12 is used to transport one single basket. A buffer blocking cylinder 121 is fixedly on an end surface of the loading buffer conveying mechanism 12 in the conveying direction. Two buffer target sensors 122 are symmetrically fixed on both sides of the buffer blocking cylinder 121. The two buffer target sensors 122 and the buffer blocking cylinder 121 cooperate to achieve a purpose of conveying one single basket, and control a conveying speed and time of the basket. In this embodiment, a structure of the loading basket conveying mechanism 14 is the same as that of the loading buffer conveying mechanism 12.

The loading basket lifting mechanism 13 includes a lifting and conveying component 131 and a basket lifting component 132. The basket lifting component 132 controls the lifting and conveying component 131. A length of the lifting and conveying component 131 matches a length of one single basket. The loading buffer conveying mechanism 12 transports one single basket to the lifting and conveying component 131, and the basket located on the lifting and conveying component 131 is fixed by a clamping device to prevent deviation caused by the loading silicon wafer conveying mechanism 15 during wafer taking, which affects a efficiency of wafer taking. In this embodiment, the basket lifting component 132 adopts a ball screw transmission to control a lifting of the lifting and conveying component 131. The loading basket lifting mechanism 13 also includes a target sensor 133 for detecting remaining silicon wafers in the basket and an orientation sensor for detecting an orientation of the incoming basket (not shown in the figure). The orientation sensor prevents reverse placement errors during basket transportation.

Figure 3:
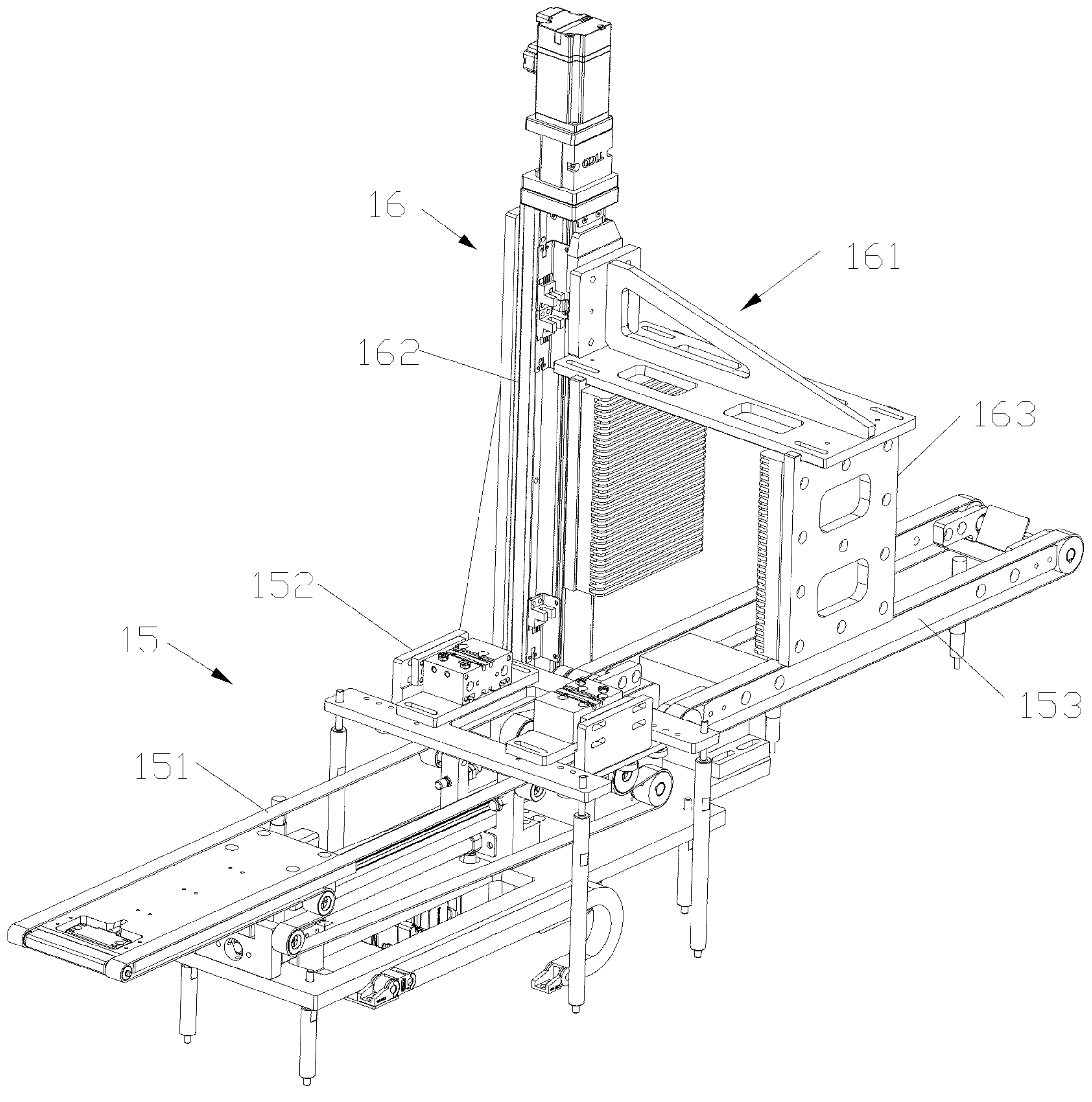
FIG. 3 is a schematic view of a loading silicon wafer conveying mechanism and a loading silicon wafer buffer mechanism of the present disclosure.

As shown in FIG. 3, the loading silicon wafer conveying mechanism 15 includes a silicon wafer input component 151, a silicon wafer conveying adjustment 152, and a silicon wafer output component 153. The silicon wafer input component 151 is coupled to the loading basket lifting mechanism 13, and the silicon wafers located inside the basket on the loading basket lifting mechanism 13 are picked up by the silicon wafer input component 151, and the function of sequentially taking out wafers is achieved by the basket lifting component 132. The silicon wafer output component 153 sequentially couples to the loading silicon wafer buffer mechanism 16 and the loading-receiving mechanism 17. The silicon wafer is transported from the silicon wafer input component 151 to the silicon wafer output component 153, and flows into the loading-receiving mechanism 17 by the silicon wafer output component 153. The silicon wafer conveying adjustment 152 is located between the silicon wafer input component 151 and the silicon wafer output component 153. The silicon wafer conveying adjustment 152 adjusts the silicon wafer to maintain uniformity during transportation, facilitate the inflow of silicon wafers and improve inflow efficiency.

The loading silicon wafer buffer mechanism 16 is located between the loading silicon wafer conveying mechanism 15 and the loading-receiving mechanism 17. As shown in FIG. 3, the loading silicon wafer buffer mechanism 16 includes a buffer component 161 and a buffer lifting component 162. The buffer component 161 includes two symmetrical buffer plates 163. The buffer lifting component 162 adopts a ball screw transmission to control a lifting of the buffer component 161. Several buffer grooves (not showed in the figure) are defined on opposite surfaces of the two buffer plates 163. A length direction of the buffer grooves is consistent with the silicon wafer delivery direction of the silicon wafer output component 153. Adjacent buffer grooves are parallel to each other vertically. The loading silicon wafer buffer mechanism 16 serves as a temporary storage mechanism for silicon wafers, avoiding the situation where the loading-receiving groove in the loading-receiving mechanism 17 is filled with silicon wafers but not taken out. At the same time, by controlling the lifting of the buffer component 161 by the buffer lifting component 162, a purpose of sequentially importing the silicon wafer conveyed on the output component 153 into the buffer grooves is achieved.

Figure 4:
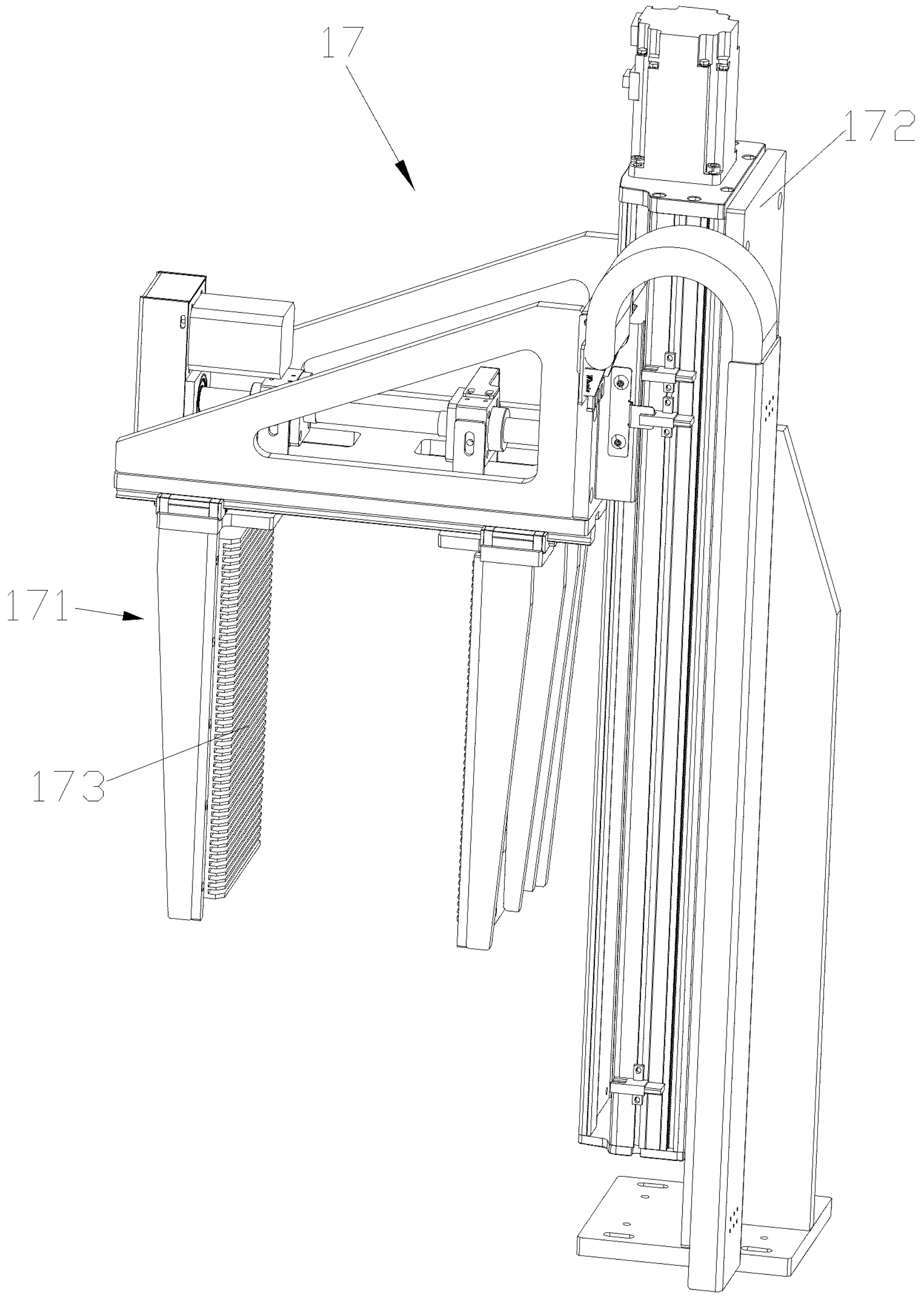
FIG. 4 is a schematic view of a loading-receiving mechanism of the present disclosure.

As shown in FIG. 4, the loading-receiving mechanism 17 includes a receiving component 171 and a receiving-lifting component 172. The receiving component 171 includes two symmetrically arranged receiving plates 173 and a power component that drives the receiving plates 173 to move. The receiving-lifting component 172 adopts a ball screw transmission to control a lifting of the receiving assembly 171. The power component moves the receiving plates 173 by using a ball screw drive method, and a distance between the two receiving plates 173 is controlled. Several loading-receiving grooves (not shown in the figure) are defined on the opposite surfaces of the two of receiving plates 173. A length direction of the loading-receiving grooves is consistent with the conveying direction of the silicon wafer output component 153. The adjacent loading and receiving grooves are vertically and parallel. The silicon wafer flows into the loading-receiving groove, and a purpose of sequentially guiding the silicon wafers conveyed on the silicon wafer output component 153 into the loading-receiving groove is achieved by lifting control of the receiving component 171 by the receiving-lifting component 172.

Figure 2:
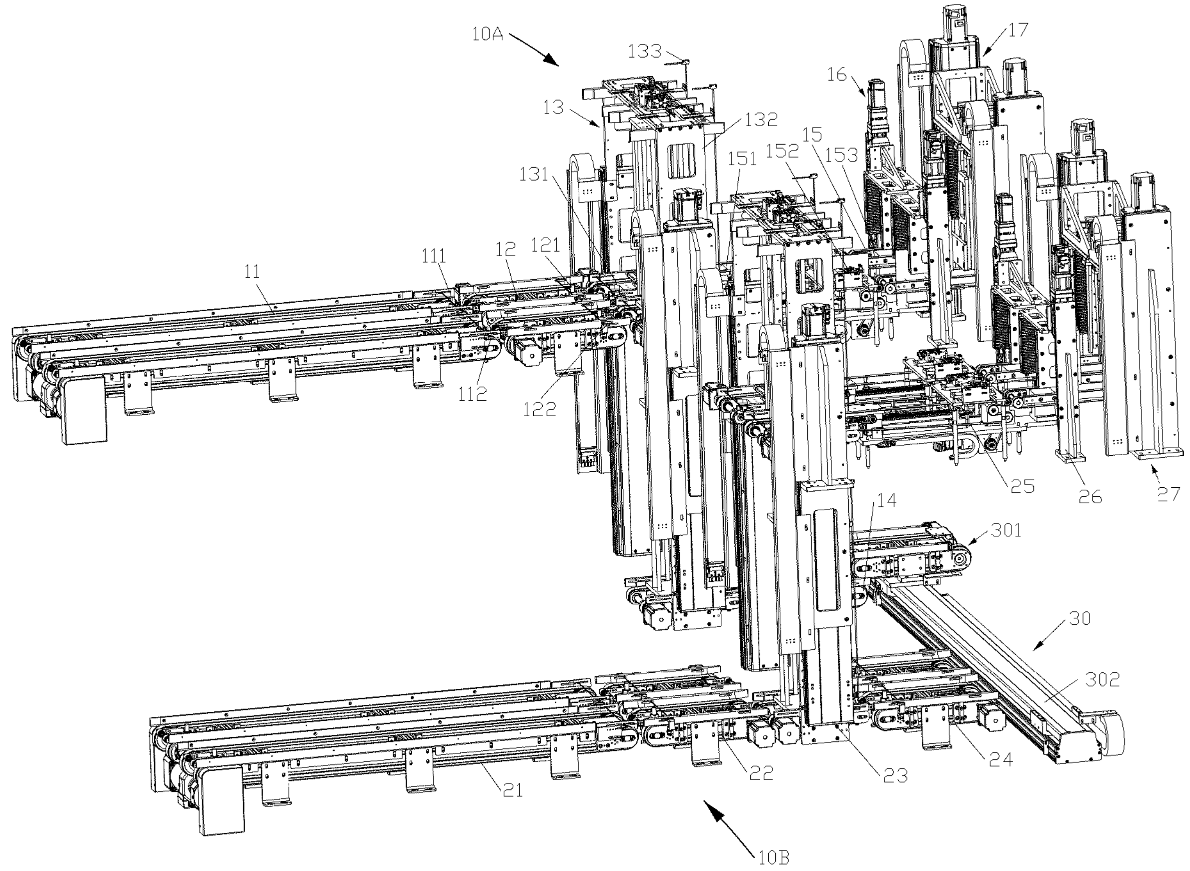
FIG. 2 is a schematic view of a wafer guiding apparatus of the present disclosure.

As shown in FIG. 2, the lateral conveying mechanism 30 includes a flow conveying component 301 and a flow moving component 302. The flow moving component 302 includes a lateral moving power component, which is driven by a ball screw transmission method to move the flow conveying component 301 relative to the flow moving component 302. The flow conveying component 301 is connected to each of the loading basket conveying mechanism 14 and the unloading basket conveying mechanism 24 during a movement process. An upper end surface of the flow conveying component 301 is in a same horizontal plane as an upper end surface of the loading basket conveying mechanism 14 and the unloading basket conveying mechanism 24, ensuring a smooth transition of the baskets.

Figure 5:
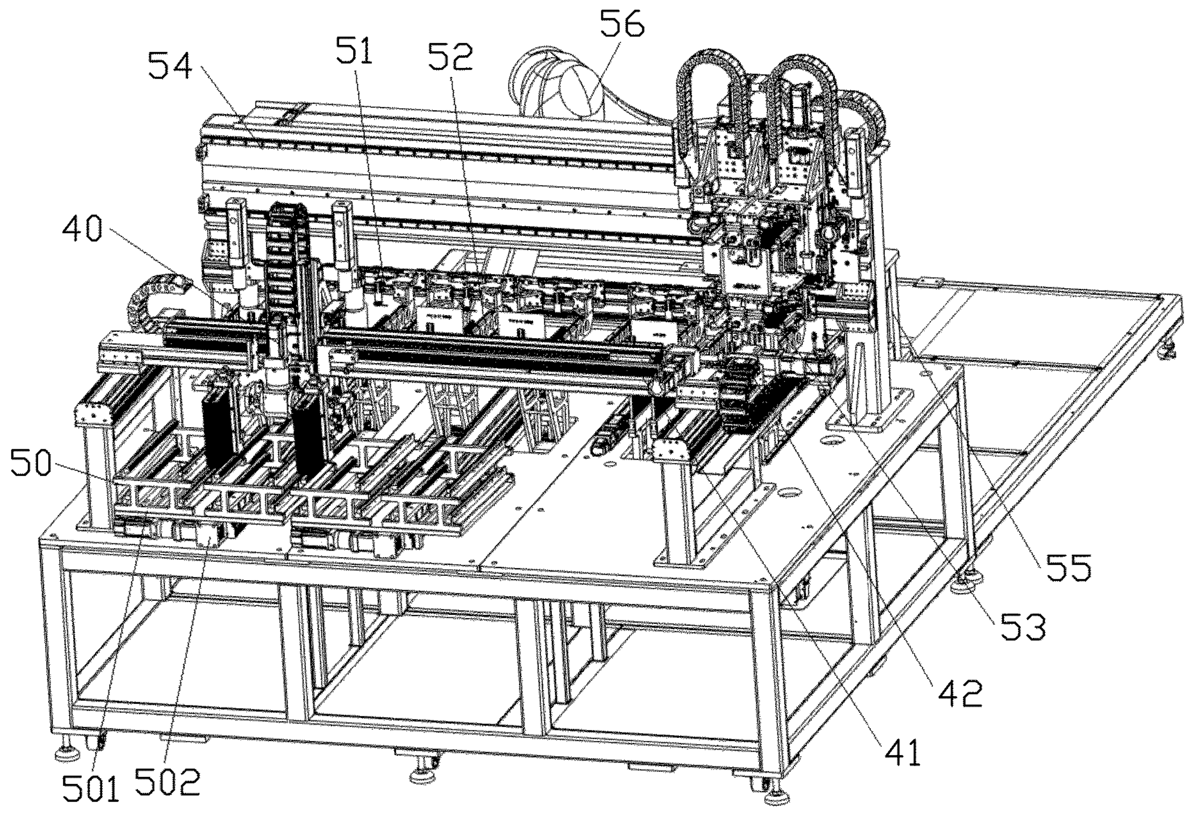
FIG. 5 is a schematic view of a silicon wafer flipping apparatus and a conveying apparatus of the present disclosure.

As shown in FIG. 5, the silicon wafer flipping apparatus 20 includes a silicon wafer flipping mechanism 40, a silicon wafer lateral moving mechanism 41, and a silicon wafer offset mechanism 42. The silicon wafer lateral moving mechanism 41 includes a silicon wafer lateral moving power component. The silicon wafer offset mechanism 42 includes a silicon wafer offset power component. Both the silicon wafer lateral moving power component and the silicon wafer offset power component are driven by a ball screw transmission method, and the silicon wafer flipping mechanism 40 is moved horizontally by the above driving method, to achieve transportation of silicon wafers. The silicon wafer flipping mechanism 40 includes a suction component 400, which includes a flipping motor 401 and a suction component 408. The flipping motor 401 and the suction component 408 control flipping of the silicon wafers.

Figure 7:
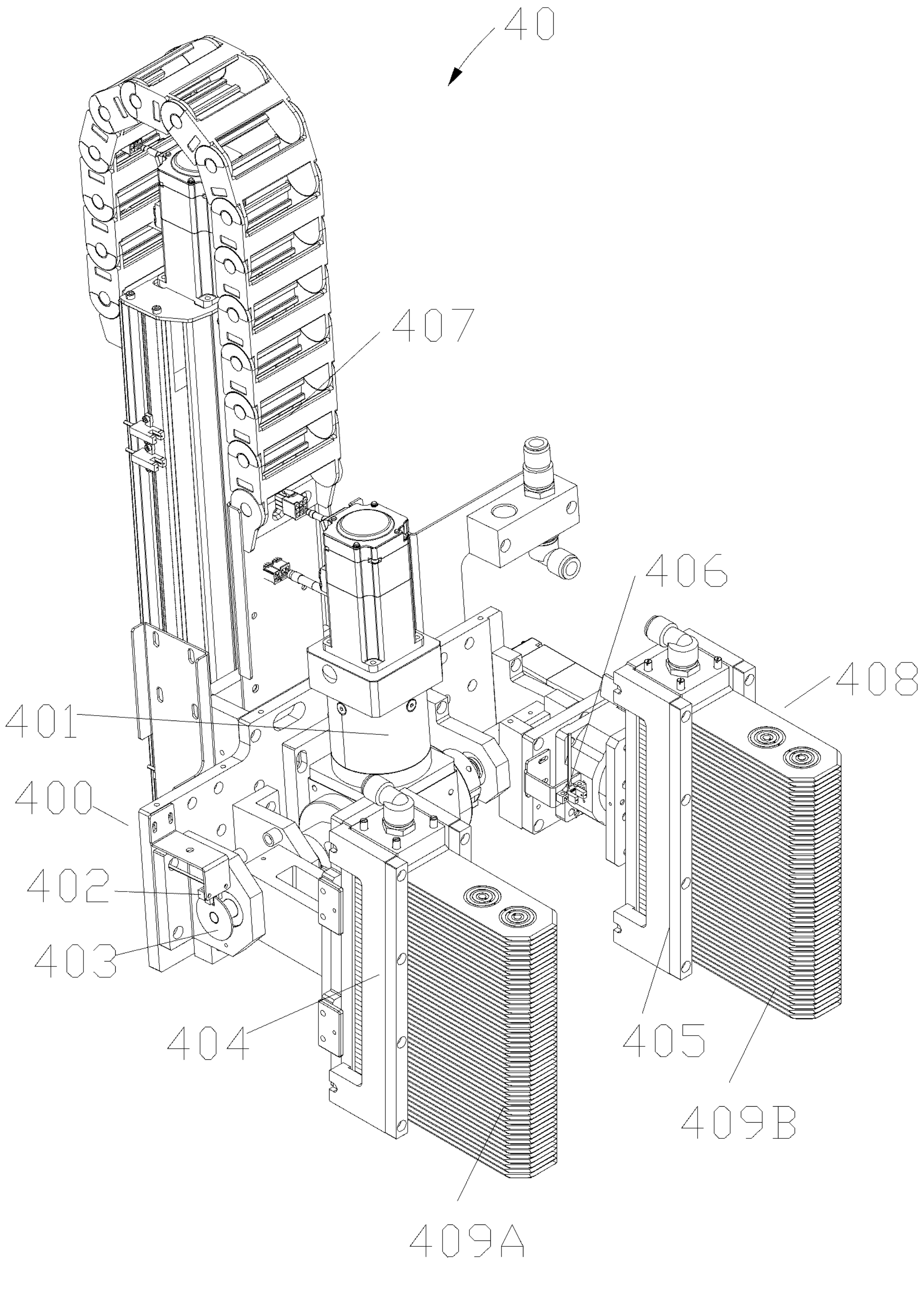
FIG. 7 is a schematic view of the silicon wafer flipping mechanism of the present disclosure.

As shown in FIG. 7, the silicon wafer flipping mechanism 40 includes a longitudinal moving component 407 and a suction component 400. The longitudinal moving component 407 includes a power component, which drives the suction component 400 to vertically move relative to the longitudinal moving component 407 by a ball screw transmission method. The suction component 400 includes a flipping motor 401 and suction components 408. There are two suction components 408, and the flipping motor 401 is connected to the two suction components 408. In this embodiment, as shown in FIG. 7, one of the two suction components 408 includes a first suction plate 404 and first suction cups 409A, and the other of the two suction components 408 includes a second suction plate 405 and second suction cups 409B. An output shaft of the flipping motor 401 is connected to each of the first suction plate 404 and the second suction plate 405. Several first suction cups 409A are installed on the first suction plate 404, and several second suction cups 409B are installed on the second suction plate 405. A distance between the first suction cups 409A and the second suction cups 409B matches a distance between the two loading-receiving mechanisms 17. The first suction cups 409A and the second suction cups 409B are sequentially inserted into adjacent loading-receiving grooves or unloading-receiving grooves to suck or place the silicon wafers, thereby achieving exporting or importing of the silicon wafers into the wafer guiding apparatus 10. The second suction plate 405 is horizontally flipped relative to the first suction plate 404, with a flipping angle of 180 degrees. Before and after the flipping of the second suction plate 405, the second suction plate 405 and the first suction plate 404 are kept parallel to achieve flipping of the silicon wafers. In the loading system, the silicon wafers sucked from the loading-receiving mechanism 17 are flipped by the second suction plate 405 to preprocess the subsequent back-to-back of the silicon wafers. In the unloading system, the silicon wafers in the back-to-back position are flipped by the second suction plate 405 to ensure that orientations of the silicon wafers introduced into the unloading-receiving mechanism 27 are consistent.

As shown in FIG. 7, the silicon wafer flipping mechanism 40 further includes a first U-shaped sensor 402 and a baffle 403 matched with each other, as well as a second U-shaped sensor 406 and a flipping plate (not shown in the figure) matched with each other. The first U-shaped sensor 402 and baffle 403 cooperate to detect horizontal state of the first suction plate 404 and the second suction plate 405. The second U-shaped sensor 406 and the flipping plate cooperate to detect flipping state of the second suction plate 405.

Figure 6:
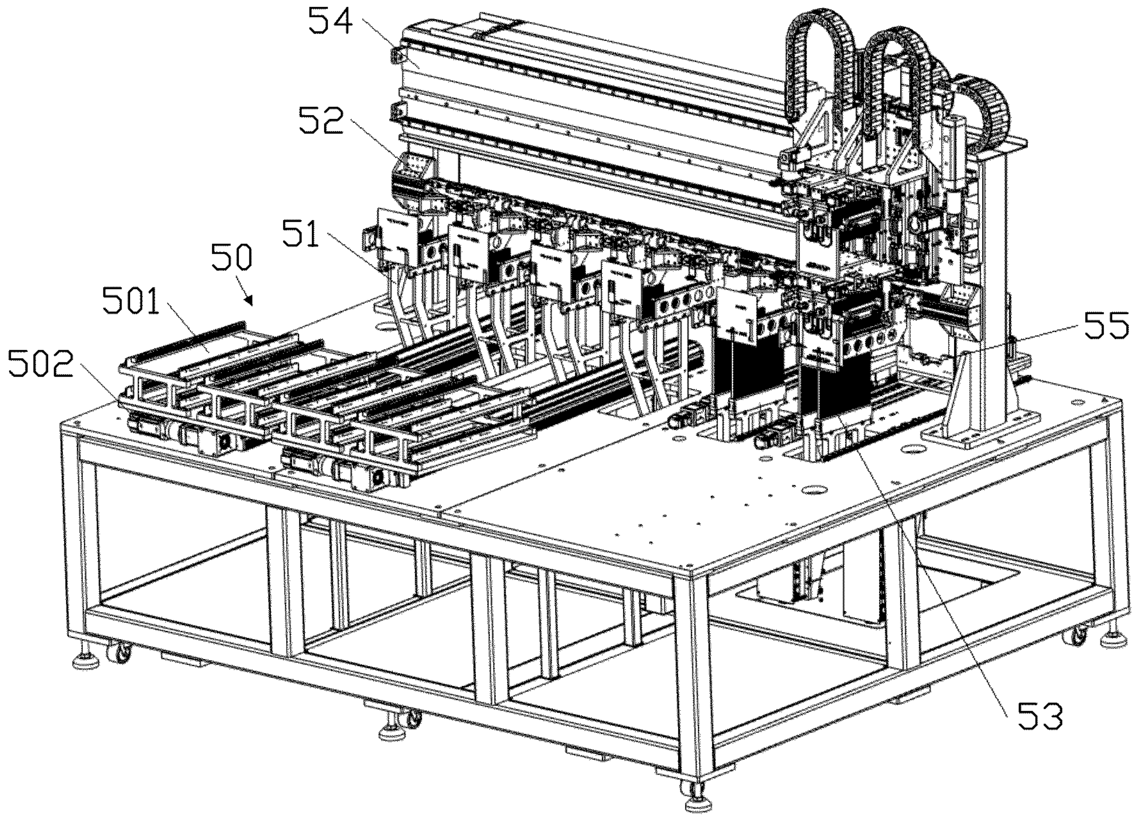
FIG. 6 is a schematic view of the silicon wafer flipping apparatus of the present disclosure.

As shown in FIG. 6, the conveying apparatus 60 includes a basket positioning-moving mechanism 50, a basket silicon wafer lifting mechanism 51, a silicon wafer regularity mechanism 52, a carrier silicon wafer lifting mechanism 53, a suction cup lateral moving mechanism 54, a carrier positioning-moving mechanism 55, a carrier flipping-moving component 56, and a carrier holder conveying mechanism 57. The basket positioning-moving mechanism 50, the basket silicon wafer lifting mechanism 51, the carrier silicon wafer lifting mechanism 53, the suction cup lateral moving mechanism 54, and the carrier positioning-moving mechanism 55 control transportation and flow of the silicon wafers. The silicon wafer regularity mechanism 52 adjusts lifting of the basket silicon wafer lifting mechanism 51 and the silicon wafers in the carrier silicon wafer lifting mechanism 53. The carrier flipping-moving component 56 transports and flips the carrier, and the carrier holder conveying mechanism 57 is connected to the main apparatus to control input or output of the silicon wafers to the main apparatus. The carrier can be a quartz boat or any other boat, such as a boat made of silicon carbide.

As shown in FIG. 5, there are two basket positioning-moving mechanisms 50. The basket positioning-moving mechanism 50 includes a supporting component 501 for carrying the basket and a driving component 502 for moving the supporting component 501. In this embodiment, one driving component 502 is connected to two supporting components 501. That is, one driving component 502 drives two supporting components 501 to move. The driving component 502 includes a moving-positioning power component. The moving-positioning power component adopts a ball screw transmission method to drive the supporting component 501, achieving transportation of the silicon wafers.

Figure 8:
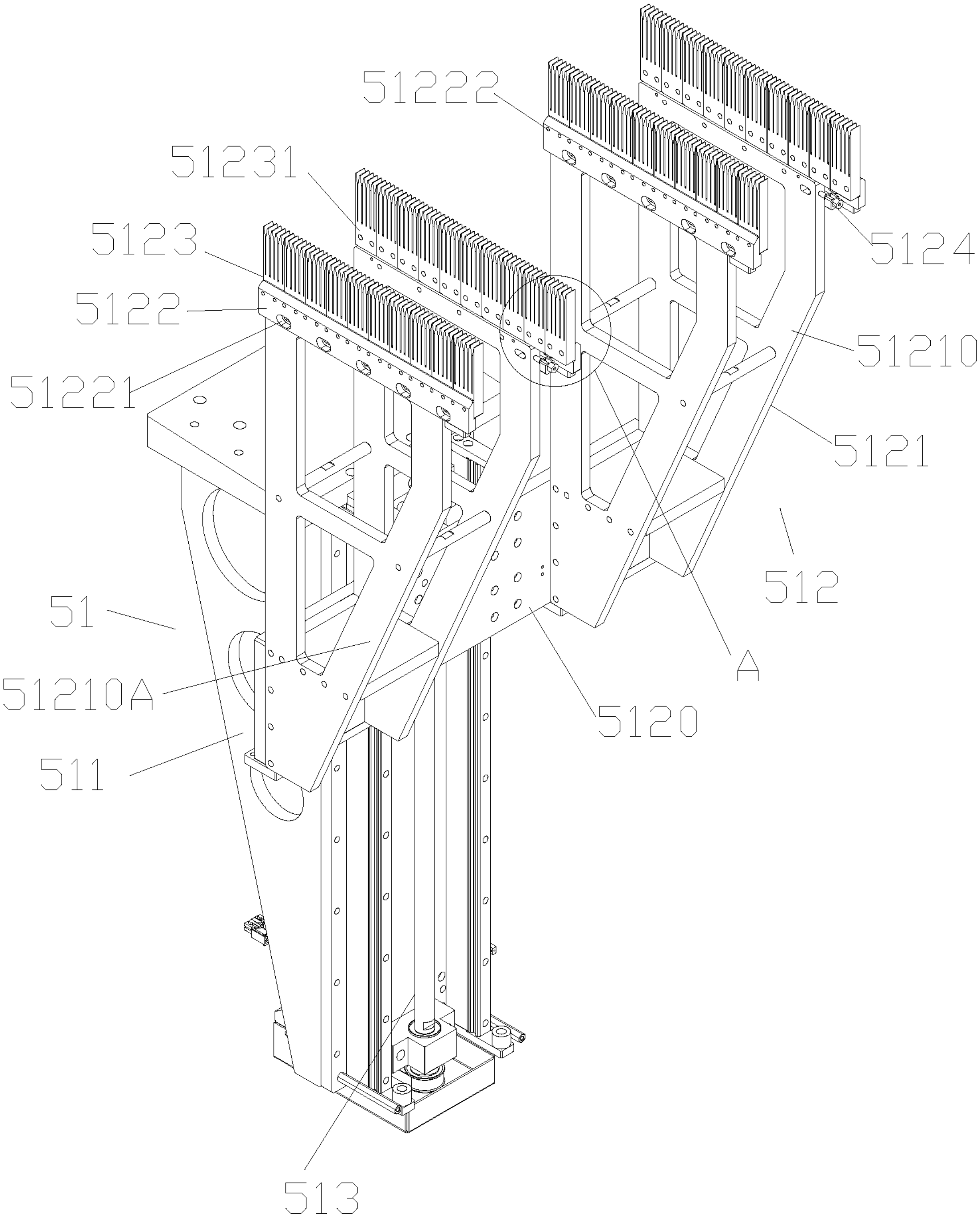
FIG. 8 is a schematic view of the baskets silicon wafer lifting mechanism of the present disclosure.

As shown in FIG. 8, the basket silicon wafer lifting mechanism 51 includes a bearing frame 511 and a lifting assembly t 512. The bearing frame 511 includes a lifting power component 513, which controls lifting of the lifting component 512. The lifting assembly 512 includes a lifting connecting plate 5120 and a lifting component 5121. The lifting component 5121 includes a lifting frame component 51210, a jacking tooth fixing plate 5122, and a jacking tooth component 5123. The jacking tooth component 5123 is installed on a lifting frame plate 51210A by the jacking tooth fixing plate 5122. The jacking tooth component 5123 is composed of several jacking teeth 51231. One group of jacking teeth 51231 is equipped with several grooves 51234, and the silicon wafers import or export the grooves 51234.

The lifting power component 513 adopts a ball screw transmission method.

As shown in FIG. 8, there are two lifting components 5121 installed horizontally and symmetrically at both ends of the lifting connecting plate 5120. A distance between the two lifting components 5121 matches a distance between the two suction components 408. The lifting assembly 512 lifts the silicon wafers from the supporting component 501 or flows the silicon wafers to the supporting component 501. The lifting frame component 51210 includes two horizontally symmetrically distributed lifting frame plates 51210A. The lifting frame plates 51210A are connected by lifting frame connecting rods. In this embodiment, a lifting component 5121 is equipped with two jacking tooth components 5123. The two jacking tooth components 5123 correspond to the one supporting component 501. That is, two jacking tooth components 5123 lift or place silicon wafers inside the supporting component 501. In this embodiment, one jacking tooth component 5123 corresponds to one lifting frame plate 51210A.

Figure 9:
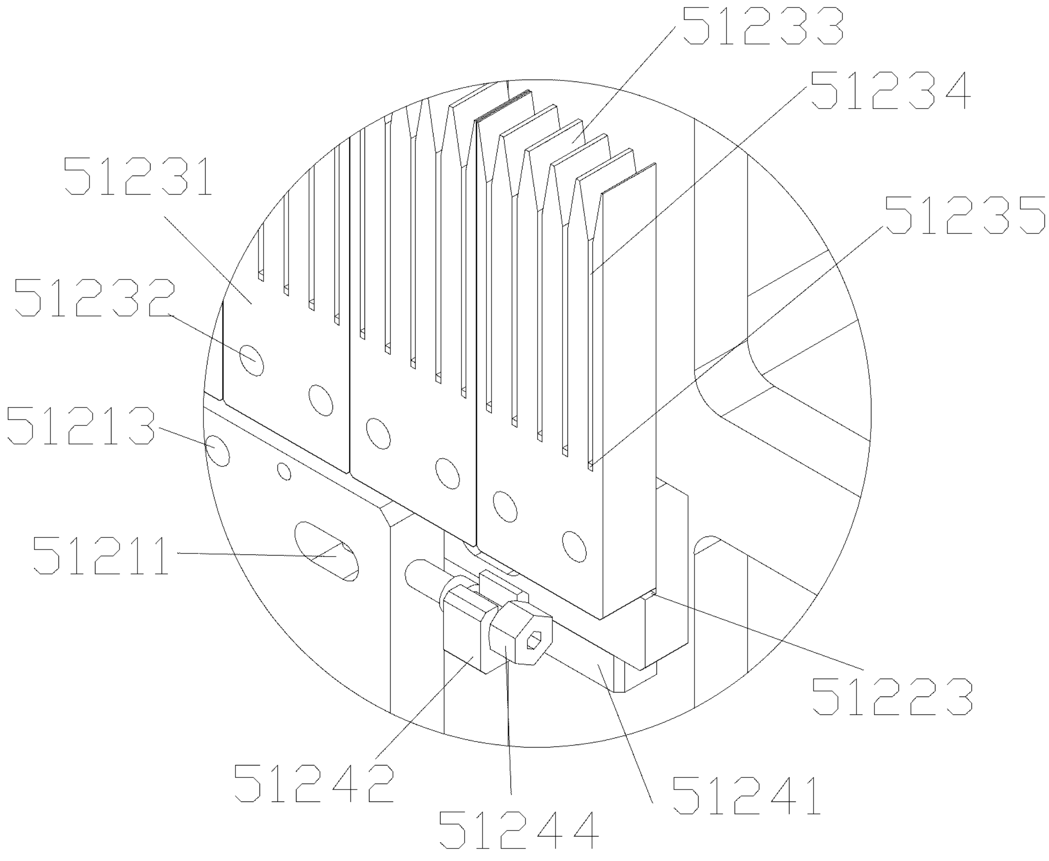
FIG. 9 is an enlarged view of portion A of FIG. 8.
Figure 10:
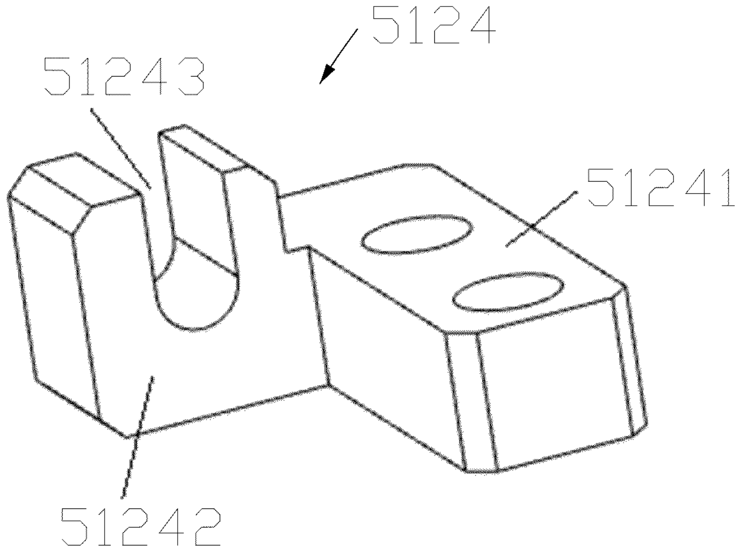
FIG. 10 is a schematic view of a connection stabilization device of the present disclosure.

As shown in FIG. 8 and FIG. 9, in this embodiment, the jacking tooth fixing plate 5122 is secured to the lifting frame plate 51210A, and the jacking tooth component 5123 is fixed on the jacking tooth fixing plate 5122, thereby achieving relative fixed installation of the jacking tooth component 5123 and the lifting frame plate 51210A. Specifically, there are several lifting connection through holes 51213 in the lifting frame plate 51210A, and lifting connection adjustment holes 51221 matching with the lifting connection through holes 51213 is provided in the jacking tooth fixing plate 5122. The lifting connection through holes 51213 corresponds one-to-one with the lifting connection adjustment holes 51221, and a fixed connection between the two is achieved by a corresponding connection device (not shown in the figure). The connection device can be conventional devices such as bolts, screws, etc. The design of the lifting connection adjustment hole 51221 can fine tune installation of the two, reducing their compatibility and processing requirements. On the other hand, it can prevent problems of unstable installation occurs between the two due to wear and tear after long-term use, which improves service time of the parts. In order to further ensure stability of their installation, a connection stabilization device 5124 is also installed between the lifting connection through holes 51213 and the lifting connection adjustment holes 51221. As shown in FIG. 10, the connection stabilization device 5124 includes a connection stabilization fixing part 51241 and a connection stabilization adjustment part 51242, which are connected. The connection stabilization fixing part 51241 is connected to a lower end surface of the jacking tooth fixing plate 5122, and the connection stabilization adjustment part 51242 is opposite to the lifting frame plate 51210A. The connection stabilization adjustment part 51242 defines a stable perforation 51243. A stable adjustment rod 51244 is inserted in the stable perforation 51243. The lifting frame plate 51210A defines a frame adjustment waist hole 51211, and the stable adjustment rod 51244 extends into the frame adjustment waist hole 51211. A position of the jacking tooth fixing plate 5122 relative to the lifting frame plate 51210A is controlled by adjusting a length of the stable adjustment rod 51244 extending into the frame adjustment waist hole 51211. This not only facilitates the adjustment of both positions, but also fixes their installation on the side to ensure stability of their installation.

The adjacent jacking teeth 51231 are tightly connected, and a cushion block 51235 for buffering is fixed on a bottom wall of each groove 51234. The upper end of each groove 51234 is connected to a guiding cavity 51233, and an angle between sidewalls of two guiding cavities 51233 is set to an acute angle. An angle between a side wall of each guiding cavity 51233 and a side wall of the groove 51234 is set as an obtuse angle. A cross-section of the guiding cavity 51233 and the groove 51234 have a funnel shape, which facilitates importing and exporting of the silicon wafers. A distance between adjacent grooves 51234 of each jacking tooth component 5123 is kept consistent, so that the silicon wafers are sequentially introduced into the groove 51234.

The jacking tooth 51231 defines several jacking tooth connection holes 51232. The jacking tooth fixing plate 5122 defines jacking tooth fixing holes 51222 that match the jacking tooth connection holes 51232. The jacking tooth connection holes 51232 and the jacking tooth fixing holes 51222 have a one-to-one corresponding relationship, and are connected by a corresponding connecting device (not shown in the figure). The connecting device can be conventional device such as a bolts, a screw, etc. Furthermore, the jacking tooth fixing plate 5122 defines a jacking tooth installation cavity 51223. A lower end surface of the jacking tooth component 5123 resists against the jacking tooth installation cavity 51223, facilitating positioning and installation of the jacking tooth fixing plate 5122 and the jacking tooth 51231.

Figure 11:
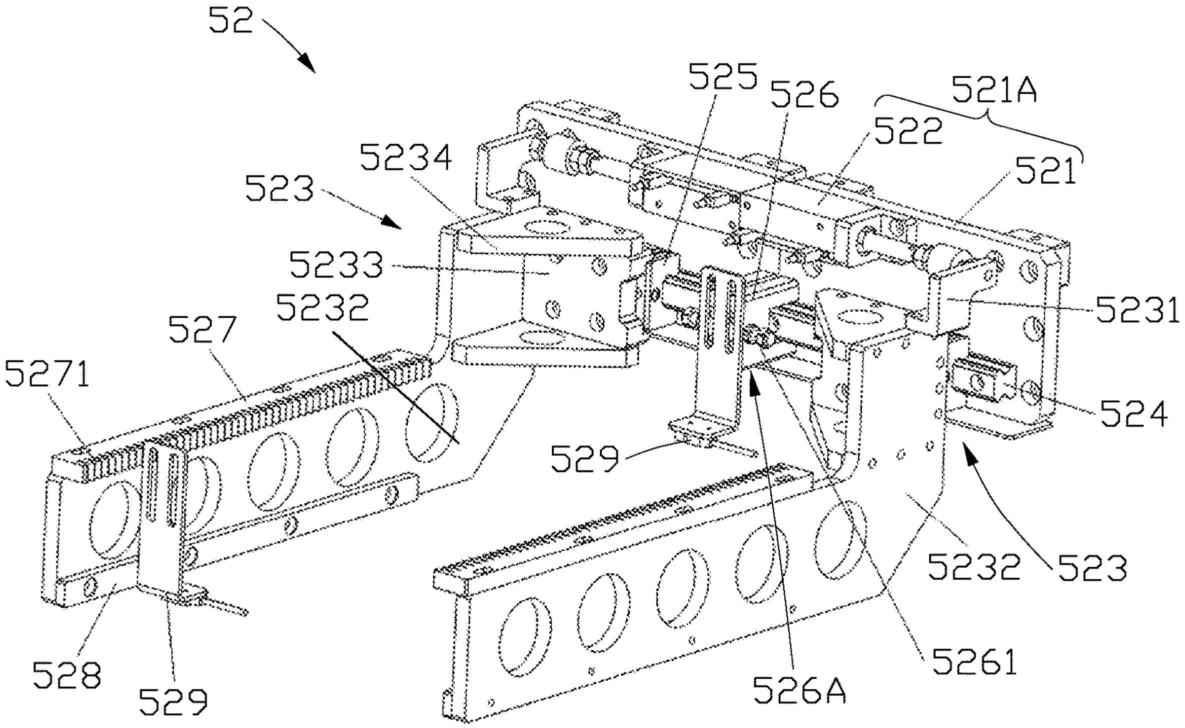
FIG. 11 is a schematic view of a silicon wafer regularity mechanism of the present disclosure.

As shown in FIG. 11, the silicon wafer regularity mechanism 52 includes a silicon wafer regularity component and a silicon wafer regularity restriction component 526A. The silicon wafer regularity component includes a silicon wafer regularity power component 521A and two silicon wafer regular moving components 523. The power component of silicon wafer regularity drives the two silicon wafer regular moving components 523 to move closer or farther away from each other. The silicon wafer regularity restriction component 526A restricts movement of the silicon wafer regular moving components 523 and detects the silicon wafer. In this embodiment, there are two symmetrical silicon wafer regularity components. The silicon wafer regularity power component 521A includes a silicon wafer regular fixing plate 521 and silicon wafer regular cylinders 522 fixed on the silicon wafer regular fixing plate 521. The silicon wafer regular cylinder 522 is connected to the silicon wafer regular moving component 523. The silicon wafer regular moving component 523 includes a silicon wafer regular connecting plate 5231 and a silicon wafer regular adjusting plate 5232 connected to the silicon wafer regular connecting plate 5231. The silicon wafer regular connecting plate 5231 is connected to an output shaft of the silicon wafer regular cylinder 522. The silicon wafer regular cylinder 522 drives the silicon wafer regular adjusting plate 5232 to move by the silicon wafer regular connecting plate 5231. A silicon wafer regular sliding rail 524 is installed on the silicon wafer regular fixing plate 521. A silicon wafer regular slider 525 is slidably installed on the silicon wafer regular slide rail 524. A silicon wafer regular slider plate 5233 fixed on the silicon wafer regular slider 525. The silicon wafer regular slider plate 5233 is connected to the silicon wafer regular adjusting plate 5232 by a silicon wafer regular reinforcement plate 5234. In this embodiment, the silicon wafer regular cylinder 522 of two silicon wafer alignment components controls the two silicon wafer regular adjusting plates 5232 to synchronous move closer or farther away from each other. As shown in FIG. 11, opposite surfaces of the two silicon wafer regular adjusting plates 5232 are respectively fixed with a silicon wafer regular slot plate 527 and a silicon wafer regular buckle plate 528. The silicon wafer regular slot plate 527 defines silicon wafer regular slots 5271, and a number and positions of silicon wafer regular slots 5271 match a number and positions of silicon wafers on the basket silicon wafer lifting mechanism 51. A connecting line of two corresponding silicon wafer regular slots 5271 on the two silicon wafer regular slot plates 527 is parallel to the silicon wafer on the basket silicon wafer lifting mechanism 51, and an opening direction of the silicon wafer regular slots 5271 faces the silicon wafer. When adjusting the silicon wafer, the silicon wafer regularity mechanism 52 controls two silicon wafer regularity adjustment plates 5232 to synchronously move close to each other, causing opposite sides of the silicon wafer to buckle into the silicon wafer regularity slots 5271. The silicon wafer regular buckle plate 528 restricts insertion of the silicon wafer regular slots 5271. The silicon wafer regular slot 5271 is designed as an open structure, which facilitates entry and exit of the silicon wafers.

As shown in FIG. 11, the silicon wafer regularity restriction component 526A is located between two silicon wafer regular moving components 523. The silicon wafer regularity restriction component 526A includes a silicon wafer regularity limiting block 526. A wafer regularity adjusting rod 5261 is fixed on the a side surface of the silicon wafer regularity limiting block 526 facing the silicon wafer regular slider 525. An elastic material is on an end of the wafer regularity adjusting rods 5261 and is used to prevent a movement of the silicon wafer regular slider 525 from exceeding the limit. At least one silicon wafer regularity sensor 529 is fixed on the silicon wafer regularity limiting block 526. There are two silicon wafer regularity sensors 529. A full and shortage status of the basket silicon wafer lifting mechanism 51 can be detected to prevent empty lifting problems by the silicon wafer regularity sensor 529.

The carrier silicon wafer lifting mechanism 53 includes a silicon wafer lifting moving component and a carrier jacking tooth component. A power component of the silicon wafer lifting moving component drives the carrier jacking tooth component to move back and forth by using a ball screw drive method. The carrier jacking tooth component pushes out the silicon wafers in the carrier positioning-moving mechanism 55 or places the silicon wafers in the carrier jacking tooth component into the carrier positioning-moving mechanism 55.

The suction cup lateral moving mechanism 54 includes a lateral mechanism and a silicon wafer suction and separation mechanism. The silicon wafer suction and separation mechanism controls suction and separation of the silicon wafers. The lateral mechanism controls a horizontal movement of the silicon wafer suction and separation mechanism, thereby controlling a flow of the silicon wafers between the basket silicon wafer lifting mechanism 51 and the carrier silicon wafer lifting mechanism 53.

As shown in FIG. 1, the carrier holder conveying mechanism 57 includes a carrier holder component 572 carrying the carrier holders and a moving component 571 driving the movement of the carrier holder component 572. The moving component 571 includes a conveying power component, which drives the carrier holder component 572 to move by using a synchronous belt driving method.

In this embodiment, during the loading process of the silicon wafers, one single basket filled with silicon wafers is sequentially transported to the loading buffer conveying mechanism 12 by the loading incoming material docking conveying mechanism 11. The loading buffer conveying mechanism 12 transports the baskets to the loading basket lifting mechanism 13. By collaborative operation of silicon input component 151 and the basket lifting component 132, the silicon wafers in the basket are sequentially output. By collaborative operation of the silicon wafer output component 153 and the receiving-lifting component 172, the silicon wafers on the conveying line are sequentially fed into the loading-receiving grooves of the loading-receiving mechanism 17. The silicon wafer flipping apparatus 20 takes out the silicon wafers in the loading-receiving groove by the suction cups 409. At this time, the second suction plate 405 is flipped to make the silicon wafers on the first suction plate 404 and the silicon wafers on the second suction plate 405 face opposite directions. The silicon wafer flipping apparatus 20 places the silicon wafer into the basket positioning-moving mechanism 50. The basket positioning-moving mechanism 50 moves above the basket silicon wafer lifting mechanism 51, and the lifting component 512 moves upward to lift the silicon wafer. The lifted silicon wafer is adjusted by the silicon wafer regularity mechanism 52, and the suction cup lateral moving mechanism 54 moves the lifted silicon wafer to the carrier silicon wafer lifting mechanism 53. The carrier jacking tooth component is moved downwards to place the silicon wafer onto the carrier positioning-moving mechanism 55 for lamination. The above steps are repeated until the carrier positioning-moving mechanism 55 is filled with silicon wafers. The carrier flipping-moving component 56 flips and transports the carrier filled with silicon wafers onto the carrier holder of the carrier holder conveying mechanism 57. The carrier holder conveying mechanism 57 inputs the silicon wafers into the main apparatus, thus realizing the loading process of silicon wafers from the wafer guiding apparatus 10 to the main machine. When the silicon wafer flows in reverse by the above structures, an unloading process from the main apparatus to the wafer guiding device is achieved.

In addition, in this embodiment, the driving method of the above-mentioned power component can be motor plus synchronous belt, motor plus gear rack or cylinder.

the present disclosure has following advantages.

1) The present disclosure uses sensors to detect a full state or an insufficient state of the basket, achieving precise control of a number of silicon wafers. The present disclosure uses target sensors to detect remaining silicon wafers in the basket, and also uses orientation sensors to detect an orientation of the basket, preventing reverse placement errors during basket transportation and improving the automation control level of the equipment.

2) The present disclosure achieves a purpose of sequentially guiding the silicon wafers conveyed on the output component of the silicon wafer into the loading-receiving slots by controlling lifting of the receiving component through the receiving lifting component. By controlling the lifting of the buffer component through the buffer lifting component, a purpose of sequentially guiding the silicon wafers conveyed on the output component of the silicon wafers into the buffer slots is achieved.

3) The present disclosure realizes a loading process of silicon wafers from the wafer guide device to a main apparatus, as well as the loading process from the main apparatus to the wafer guiding device, and realizes a cyclic loading and unloading process of silicon wafers.

4). The present disclosure sequentially inserts suction cups into adjacent loading-receiving slots or unloading-receiving slots to extract or place silicon wafers, thereby achieving export or import of silicon wafers into the guiding apparatus. The silicon wafer flipping mechanism flips the silicon wafers. In the loading system, a set of suction components flip the silicon wafers sucked from the loading-receiving mechanism, which is used for pre-treatment of subsequent back-to-back silicon wafers. In the unloading system, the back-to-back silicon wafers are flipped through another set of suction components to ensure that the silicon wafers introduced into the unloading-receiving mechanism are oriented uniformly.

5) The jacking tooth fixing plate lifting defines connection adjustment hole to fine tune installation of the jacking tooth fixing plate and the lifting frame plate. On the one hand, it reduces the adaptability of the two and reduces the processing requirements of the two. On the other hand, it can prevent the problem of unstable installation of the two after long-term wear and tear, and improve the service life of the parts. The present disclosure designs a connection stabilization device, which not only facilitates adjustment of the positions of the jacking tooth fixing plate and the lifting frame plate, but also fixes installation of the two on the side to ensure the stability of their installation. The present disclosure designs a funnel-shaped guiding cavity at the upper end of the slot to facilitate the import and export of silicon wafers. The present disclosure designs a jacking tooth installation cavity on the jacking tooth fixing plate, which facilitates the positioning and installation of the jacking tooth fixing plate and jacking teeth.

6) The present disclosure designs a silicon wafer regularity mechanism to regulate the silicon wafers inside the basket silicon wafer lifting mechanism, ensuring the uniformity of the silicon wafers, facilitating the next step of operation, and improving efficiency. The present disclosure controls synchronous movement of the silicon wafer regularity adjustment plate by a silicon wafer regularity cylinder, thereby improving the efficiency of silicon wafer regularity. The present disclosure designs the regular slot holes of the silicon wafer as an open structure, which facilitates the entry and exit of the silicon wafer. The present disclosure uses the silicon wafer regularity restriction component to prevent the movement of the silicon wafer regularity slider from exceeding the limit. At the same time, the silicon wafer regularity sensor can determine whether the basket silicon wafer lifting mechanism contains silicon wafers, preventing problems of empty lifting.

The above-described embodiments have only expressed several embodiments of the present disclosure, which are described in more specific and detailed, but are not therefore to be construed as limiting the scope of the present disclosure. It should be noted that variations and modifications may be made to those of skill in the art without departing from the spirit of the present disclosure, all of which fall within the scope of the present disclosure. Therefore, the scope of protection of the patent of the present application shall be subject to the appended claims.

What is claimed is:

1. A loading and unloading system for silicon wafer, comprising:

a wafer guiding apparatus comprising a loading-guiding assembly, an unloading-guiding assembly, and a lateral conveying device connecting to each of the loading-guiding assembly and the unloading-guiding assembly, the loading-guiding assembly configured to control loading of silicon wafers, the unloading-guiding assembly configured to control unloading of the silicon wafers, and the lateral conveying device configured to flow baskets in the loading-guiding assembly and baskets in the unloading-guiding assembly;

a silicon wafer flipping apparatus comprising a silicon wafer flipping mechanism, a silicon wafer lateral moving mechanism, and a silicon wafer shift mechanism, the silicon wafer lateral moving mechanism and the silicon wafer shift mechanism configured to control moving of the silicon wafer flipping mechanism, the silicon wafer flipping mechanism configured to flip the silicon wafers; and a conveying apparatus configured to control flowing of silicon wafers between a main apparatus configured to process the silicon wafers and the silicon wafer flipping apparatus.

2. The loading and unloading system for silicon wafer of claim 1, wherein the loading-guiding assembly comprises sequentially connected a loading docking-conveying mechanism, a loading buffer conveying mechanism, a loading basket lifting mechanism, a loading basket conveying mechanism, a loading silicon wafer conveying mechanism, a loading silicon wafer buffer mechanism, and a loading-receiving mechanism;

the loading basket conveying mechanism is located on a lower side of the loading basket lifting mechanism;

the unloading-guiding assembly comprises sequentially connected an unloading docking-conveying mechanism, an unloading buffer conveying mechanism, an unloading basket lifting mechanism, an unloading basket conveying mechanism, an unloading silicon wafer conveying mechanism, an unloading silicon wafer buffer mechanism, and an unloading-receiving mechanism;

the unloading basket conveying mechanism is located on a lower side of the unloading basket lifting mechanism; and the lateral conveying device is connected to each of the loading basket conveying mechanism and the unloading basket conveying mechanism.

3. The loading and unloading system for silicon wafer of claim 1, wherein the silicon wafer flipping mechanism comprises a suction component, the suction component comprises a flipping motor and two suction components, the flipping motor and the two suction components are configured to cooperatively control flipping of the silicon wafers; the flipping motor is connected to the two suction components;

one of the two suction components comprises a first suction plate and a plurality of first suction cups on the first suction plate, and other of the two suction components comprises a second suction plate and a plurality of second suction cups on the second suction plate; the flipping motor is connected to each of the first suction plate and the second suction plate;

and the plurality of first suction cups and the plurality of second suction cups are configured to cooperatively suck or place the silicon wafers.

4. The loading and unloading system for silicon wafer of claim 1, wherein the conveying apparatus comprises at least one basket positioning-moving mechanism, a basket silicon wafer lifting mechanism, a silicon wafer regularity mechanism, a carrier silicon wafer lifting mechanism, a suction cup lateral moving mechanism, a carrier positioning-moving mechanism, a carrier flipping-moving component, and a carrier holder conveying mechanism;

the basket positioning-moving mechanism, the basket silicon wafer lifting mechanism, the carrier silicon wafer lifting mechanism, the suction cup lateral moving mechanism, and the carrier positioning-moving mechanism are configured to cooperatively control transportation and flow of the silicon wafers;

the silicon wafer regularity mechanism is configured to adjust lifting of the basket silicon wafer lifting mechanism and the silicon wafers in the carrier silicon wafer lifting mechanism;

the carrier flipping-moving component is configured to transport and flip carriers, and the carrier holder conveying mechanism is connectable to the main apparatus and is configured to control input or output of the silicon wafers to the main apparatus.

5. The loading and unloading system for silicon wafer of claim 4, wherein the conveying apparatus comprises two basket positioning-moving mechanisms;

each of the two basket positioning-moving mechanisms comprises at least one supporting component configured for carrying baskets and a driving component configured for moving the at least one supporting component;

the basket silicon wafer lifting mechanism comprises a bearing frame and a lifting assembly, the bearing frame comprises a lifting power component and a lifting assembly, the lifting power component is configured to control lifting of the lifting component;

the lifting assembly comprises a lifting connecting plate and a lifting component, the lifting component comprises a lifting frame component, a jacking tooth fixing plate, and a jacking tooth component, the jacking tooth component is installed on a lifting frame component by the jacking tooth fixing plate;

the jacking tooth component comprises a plurality of jacking teeth, each of the plurality of jacking teeth defines a plurality of grooves for importing or exporting the silicon wafers.

6. The loading and unloading system for silicon wafer of claim 5, wherein the lifting frame component comprises two symmetrical distributed lifting frame plates;

the lifting component comprises two jacking tooth components, each of the two jacking tooth components corresponds to one of the two lifting frame plates; and the jacking tooth fixing plate is connected between the lifting frame plate and the jacking tooth component.

7. The loading and unloading system for silicon wafer of claim 6, wherein a connection stabilization device is installed between jacking tooth fixing plate and the lifting frame plate; the connection stabilization device comprises a connection stabilization fixing part and a connection stabilization adjustment part connected to the connection stabilization fixing part;

the connection stabilization fixing part is connected to a lower end surface of the jacking tooth fixing plate, the connection stabilization adjustment part defines a stable perforation, a stable adjustment rod is inserted in the stable perforation, the lifting frame plate defines a frame adjustment waist hole, and the stable adjustment rod extends into the frame adjustment waist hole; and a position of the jacking tooth fixing plate relative to the lifting frame plate is controlled by adjusting a length of the stable adjustment rod extending into the frame adjustment waist hole.

8. The loading and unloading system for silicon wafer of claim 6, wherein every adjacent two of the plurality of jacking teeth are connected to each other, an upper end of each of the plurality of groove is connected to a guiding cavity; and a distance between each adjacent grooves of each jacking tooth component is kept consistent.

9. The loading and unloading system for silicon wafer of claim 4, wherein the silicon wafer regularity mechanism comprises a silicon wafer regularity power component, two silicon wafer regular moving components, and a silicon wafer regularity restriction component, the silicon wafer regularity power component is configured to drive the two silicon wafer regular moving components to move closer or farther away from each other; and the silicon wafer regularity restriction component is configured to restrict movement of the silicon wafer regular moving components and detect silicon wafer.

10. The loading and unloading system for silicon wafer of claim 9, wherein the silicon wafer regularity power component comprises a silicon wafer regular fixing plate and two silicon wafer regular cylinders fixed on the silicon wafer regular fixing plate;

each of the two silicon wafer regular cylinders is connected to the silicon wafer regular moving component;

the silicon wafer regular moving component comprises a silicon wafer regular connecting plate and a silicon wafer regular adjusting plate connected to the silicon wafer regular connecting plate;

the silicon wafer regular connecting plate is connected to an output shaft of the silicon wafer regular cylinder, the silicon wafer regular cylinder is configured to drive the silicon wafer regular adjusting plate to move by the silicon wafer regular connecting plate;

a silicon wafer regular sliding rail is installed on the silicon wafer regular fixing plate, a silicon wafer regular slider is slidably installed on the silicon wafer regular slide rail, a silicon wafer regular slider plate fixed on the silicon wafer regular slider, the silicon wafer regular slider plate is connected to the silicon wafer regular adjusting plate by a silicon wafer regular reinforcement plate.

11. The loading and unloading system for silicon wafer of claim 10, wherein the silicon wafer regularity restriction component is located between the two silicon wafer regular moving components; the silicon wafer regularity restriction component comprises a silicon wafer regularity limiting block; a wafer regularity adjusting rods is fixed on a side surface of the silicon wafer regularity limiting block facing the silicon wafer regular slider;

a silicon wafer regularity sensor is installed on the silicon wafer regularity limiting block, the silicon wafer regularity sensor is configured to detect a full and shortage status of the basket silicon wafer lifting mechanism.

12. The loading and unloading system for silicon wafer of claim 4, wherein the carrier silicon wafer lifting mechanism is configured to push out silicon wafers in the carrier positioning-moving mechanism or place silicon wafers in the carrier jacking tooth component into the carrier positioning-moving mechanism;

the suction cup lateral moving mechanism is configured to control suction and separation of the silicon wafers, thereby controlling a flow of the silicon wafers between the basket silicon wafer lifting mechanism and the carrier silicon wafer lifting mechanism; and the carrier holder conveying mechanism comprises a carrier holder component configured for carrying the carrier holders and a moving component configured for driving the movement of the carrier holder component.

13. The loading and unloading system for silicon wafer of claim 2, wherein the lateral conveying device comprises a flow conveying component and a flow moving component;

the flow moving component is configured to drive the flow conveying component to move relative to the flow moving component;

the flow conveying component is connected to each of the loading basket conveying mechanism and the unloading basket conveying mechanism during a movement process; and an upper end surface of the flow conveying component is in a same horizontal plane as an upper end surface of the loading basket conveying mechanism and an upper end surface of the unloading basket conveying mechanism.

14. The loading and unloading system for silicon wafer of claim 2, wherein the loading docking-conveying mechanism is configured to simultaneously accommodate a plurality of baskets for conveying;

loading blocking cylinders are fixed on both ends of the loading docking-conveying mechanism in a conveying direction;

two loading target sensors are symmetrically fixed on two sides of an end face of the loading docking-conveying mechanism, the two loading target sensors and the loading blocking cylinders cooperate to achieve a purpose of sequentially transporting one basket to the loading buffer conveying mechanism; and the loading docking-conveying mechanism is also equipped with several sensors for detecting a full or short material status of the basket.

* * * * *